United States Patent
Sharma

(10) Patent No.: US 7,790,624 B2
(45) Date of Patent: Sep. 7, 2010

(54) METHODS FOR REMOVING A METAL-COMPRISING MATERIAL FROM A SEMICONDUCTOR SUBSTRATE

(75) Inventor: Balgovind Sharma, Fishkill, NY (US)

(73) Assignee: Global Foundries Inc., Grand Cayman (KY)

( * ) Notice: Subject to any disclaimer, the term of this patent is extended or adjusted under 35 U.S.C. 154(b) by 11 days.

(21) Appl. No.: 12/174,497

(22) Filed: Jul. 16, 2008

(65) Prior Publication Data

US 2010/0015804 A1   Jan. 21, 2010

(51) Int. Cl.
*H01L 21/302* (2006.01)
*H01L 21/44* (2006.01)

(52) U.S. Cl. ............... 438/745; 438/685; 257/E21.214; 257/E21.476

(58) Field of Classification Search .......... 438/745
See application file for complete search history.

(56) References Cited

U.S. PATENT DOCUMENTS

| | | | |
|---|---|---|---|
| 4,040,893 A | 8/1977 | Ghezzo | |
| 2002/0045351 A1 | 4/2002 | Jo | |
| 2002/0048953 A1 | 4/2002 | Nayak | |
| 2003/0162399 A1* | 8/2003 | Singh | ............... 438/692 |
| 2003/0207513 A1 | 11/2003 | Saitou et al. | |
| 2004/0023478 A1* | 2/2004 | Samavedam et al. | ............... 438/592 |
| 2005/0136672 A1 | 6/2005 | Fujikawa et al. | |
| 2005/0156140 A1 | 7/2005 | Shimizu et al. | |
| 2007/0099406 A1 | 5/2007 | Higashi et al. | |
| 2007/0238287 A1 | 10/2007 | Greeley et al. | |

FOREIGN PATENT DOCUMENTS

| | | |
|---|---|---|
| EP | 1848033 A | 10/2007 |
| FR | 2193256 A | 2/1974 |

OTHER PUBLICATIONS

Chang, Wen-Tung, et al. "Dual-Metal-Gate-Integration Complementary Metal Oxide Semiconductor Process Scheme Using Ru Positive-Channel Metal Oxide Semiconductor and TaC Negative-Channel Metal Oxide Semiconductor Gate Electrodes," Journal of Vacuum Science and Technology, vol. 25, No. 4, Jul./Aug. 2007, pp. 1265-1269.
International Search Report for PCT/US2009/050900 mailed Oct. 8, 2009.

* cited by examiner

*Primary Examiner*—Jarrett J Stark
*Assistant Examiner*—Lawrence Tynes, Jr.
(74) *Attorney, Agent, or Firm*—Ingrassia Fisher & Lorenz, P.C.

(57) ABSTRACT

Methods for removing metal-comprising materials from semiconductor materials are provided. In accordance with an exemplary embodiment, a method comprises providing a metal-comprising material overlying a semiconductor material and exposing the metal-comprising material to an aqueous non-chlorine-comprising acid solution having a pH of about less 7.

19 Claims, 2 Drawing Sheets

METHODS FOR REMOVING A METAL-COMPRISING MATERIAL FROM A SEMICONDUCTOR SUBSTRATE

FIELD OF THE INVENTION

The present invention generally relates to methods for fabricating semiconductor devices, and more particularly relates to methods for the removal of metal-comprising materials used for high dielectric constant metal gates.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS integrated circuit (IC). There is a continuing trend to incorporate more and more circuitry on a single IC chip. To incorporate the increasing amount of circuitry, the size of each individual device in the circuit and the size and spacing between device elements (the feature size) must decrease.

High dielectric constant materials, also referred to as "high-k dielectrics," are considered for the 45 nm node technology and beyond to allow further scaling of gate dielectrics. High-k dielectrics are those materials having a dielectric constant greater than silicon dioxide ($SiO_2$) and include, for example, hafnium dioxide ($HfO_2$), hafnium silicate oxide (HfSiO), hafnium silicate oxide nitride (HfSiON), and zirconium dioxide ($ZrO_2$). To prevent Fermi-level pinning, metal gates (MG) with the proper work function are used as gate electrodes on the high-k gate dielectrics. Such metal gate electrodes typically are formed of metal-comprising materials such as aluminum (Al), magnesium (Mg), titanium-based materials such as titanium nitride (TiN), tantalum-based materials such as tantalum nitride (TaN) or tantalum carbide ($Ta_2C$), and the like. Lanthanum (La) is becoming a particularly popular metal for use in metal gates. Often, a thin oxide forms on the metal-comprising material when exposed to an ambient environment. The oxide may serve to protect the metal-comprising material from contamination.

A dual-gate CMOS device may be fabricated so that the N-channel MOS transistor (NMOS) and the P-channel MOS transistor (PMOS) are formed with different gates that have different work functions, thus making each transistor more efficient. Using the dual-gate fabrication process, a gate oxide is deposited overlying a semiconductor substrate, followed by the deposition of a first metal-comprising material, such as lanthanum, that will be used to form the NMOS. A photoresist is formed overlying the first metal-comprising material and is patterned to form an etch mask. The first metal-comprising material then is etched to form an NMOS gate stack. The photoresist is removed from the NMOS and a second gate-forming material is globally deposited and then is etched to form the gate electrode of the PMOS.

Typically, a hydrochloric acid (HCl)-based chemistry, which has a pH in the range of about less than zero to about less than one, depending on concentration, is used to remove the first metal-comprising material from the PMOS because it can do so quickly. However, HCl is a very strong acid with a chlorine atom. As a strong acid, HCl dissociation goes to completion in an aqueous medium, that is, HCl dissociates according to the equation:

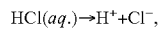

thus providing free chlorine ions. Chlorine has the highest electron affinity of the elements of the periodic chart, has a relatively high electronegativity of 3, and is a very strong oxidizing agent. Fluorine has a higher electronegativity of 4 but hydrogen fluoride (HF) does not dissociate as readily as HCl does, and therefore is a weaker acid than HCl. Accordingly, because of its reactive nature and its complete dissociation in water, HCl is a difficult etchant to control. If the concentration of the HCl chemistry is too high or the time the device is exposed to the chemistry is too long, during removal of the first metal-comprising material from the PMOS region, the HCl chemistry can undercut the first metal-comprising material of the NMOS that underlies the photoresist, which results in device degradation. Of course, if the concentration of the HCl chemistry is too low, or if the exposure time is not sufficiently long, residue of the first metal-comprising material remains on the PFET oxide, thus resulting in device defects.

Accordingly, it is desirable to provide methods for removing a metal-comprising material from a semiconductor material using an aqueous non-chlorine-comprising acid solution having a pH of less than about 7. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for removing metal-comprising materials from semiconductor materials are provided. In accordance with an exemplary embodiment of the present invention, a method for removing a metal-comprising material from a semiconductor material comprises providing the metal-comprising material overlying the semiconductor material and exposing the metal-comprising material to an aqueous non-chlorine-comprising acid solution having a pH of less about 7.

In accordance with another exemplary embodiment, a method for fabricating a semiconductor device comprises forming a high dielectric constant gate insulating material overlying a substrate and depositing a metal-comprising material overlying the high dielectric constant gate insulating material. A patterned photoresist is formed on the metal-comprising material and the metal-comprising material is exposed to an aqueous non-chlorine-comprising acid solution having a pH in the range of less than about 7 to form a first gate stack. The patterned photoresist is removed from the first gate stack.

In accordance with a further exemplary embodiment of the present invention, a method for forming a CMOS device comprises depositing a lanthanum layer overlying a high dielectric constant material disposed on a semiconductor material. The semiconductor material has an N-well region for use in fabricating a P-channel MOS and a P-well region for use in fabricating an N-channel MOS. A patterned photoresist is formed on the lanthanum layer overlying the P-well region. The lanthanum layer is etched using an aqueous non-chlorine-comprising acid solution having a pH of less than about 7 to form a first gate stack overlying the P-well region. The patterned photoresist is at least substantially removed from the first gate stack. A gate electrode-forming material having a work function different from the work function of the lanthanum layer is globally deposited overlying the first gate stack and the N-well region of semiconductor material.

The gate electrode-forming material is etched to form a gate electrode overlying the N-well region.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the methods of the present invention provide for the effective removal of a metal-comprising material, and its oxide if disposed thereon, from a semiconductor material. The methods remove the metal-comprising material and its oxide using an aqueous non-chlorine-comprising acid solution having a pH of less than about 7. The inventor has discovered that using a material having a pH of about 7 or greater does not effectively remove the metal-comprising material. Further, the inventor has discovered that using an aqueous non-chlorine-comprising acid solution having a pH of less than about 7 provides a removal method that can be controlled so that the metal-comprising material is effectively removed from the semiconductor material without the simultaneous etching of any metal-comprising material underlying a protective etch mask.

FIGS. 1-4 illustrate, in cross-section, a method for fabricating a semiconductor device 50 in accordance with an exemplary embodiment of the present invention. For illustration purposes, semiconductor device 50 is shown as a portion of a complementary MOS device. However, it will be appreciated that the various embodiments of the method for removing a metal-comprising metal are not so limited and may be used to remove a metal-comprising material during the fabrication of any semiconductor device. Various steps in the manufacture of MOS components are well known and so, in the interest of brevity, many conventional steps will only be mentioned briefly herein or will be omitted entirely without providing the well known process details. As used herein, the term "MOS device" properly refers to a device having a gate electrode formed of a metal-comprising material and an oxide gate insulator, although it is understood that the term may also be used to refer to any semiconductor device that includes a conductive gate electrode (whether metal or other conductive material) that is positioned over a gate insulator (whether oxide or other insulator) which, in turn, is positioned over a semiconductor substrate. While fabrication of only one NMOS and one PMOS is illustrated in FIGS. 1-4, it will be appreciated that the various embodiments of the methods can be used to fabricate any number of NMOS and PMOS.

Figure 1:
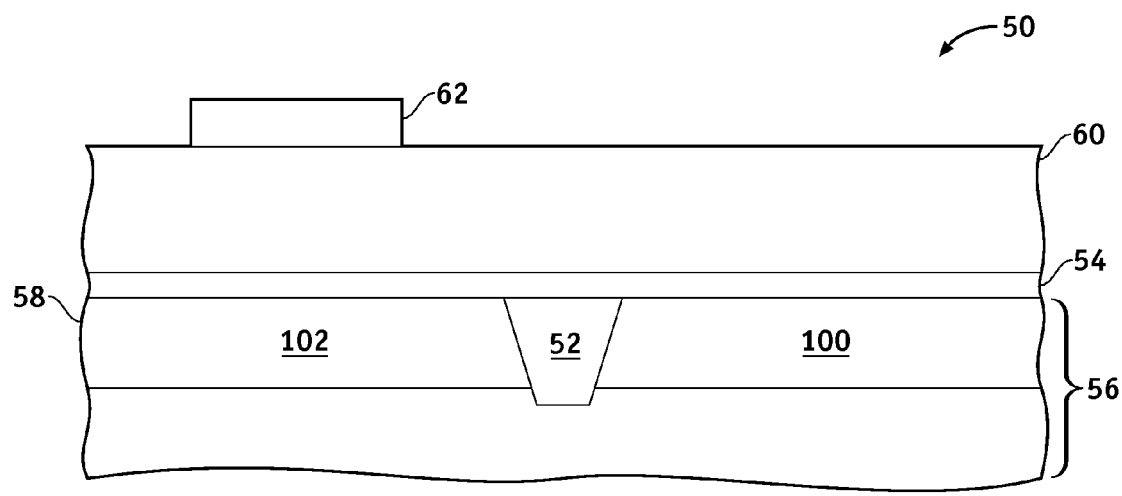
FIGS. 1-4 illustrate schematically, in cross-section, a method for fabricating a semiconductor device using an aqueous non-chlorine-comprising acid solution, in accordance with an exemplary embodiment of the present invention.

Referring to FIG. 1, in accordance with one exemplary embodiment, the method includes the step of providing a semiconductor material 56. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer, or may be a thin layer of silicon on an insulating layer (commonly know as silicon-on-insulator or SOI) that, in turn, is supported by a carrier wafer. At least a portion 58 of the silicon substrate is impurity doped, for example by forming N-type well regions 100 and P-type well regions 102 for the fabrication of the PMOS and the NMOS, respectively. The semiconductor material may comprise shallow trench isolation (STI) regions 52 used to electrically isolate subsequently formed transistors, as described in more detail below.

A gate insulator material 54 is deposited overlying the semiconductor material 56. The layer of gate insulating material 54 can be a layer of thermally grown silicon dioxide or, alternatively, a deposited insulator such as a silicon oxide, silicon nitride, or the like. Preferably, the gate insulating material 54 is formed of a deposited high dielectric constant insulator such as HfSiO, $HFO_2$, HFSiON, $ZnO_2$, or the like. Deposited insulators can be deposited, for example, by chemical vapor deposition (CVD), low pressure chemical vapor deposition (LPCVD), plasma-enhanced chemical vapor deposition (PECVD), physical vapor deposition (PVD), or atomic layer deposition (ALD). Gate insulating material 54 preferably has a thickness of about 1-10 nm, although the actual thickness can be determined based on the application of the transistor in the circuit being implemented.

A layer of metal-comprising material 60 is formed overlying the gate insulating material 54. The metal-comprising material may be formed of lanthanum (La) or lanthanum alloys, aluminum (Al) or aluminum alloys, magnesium (Mg) or magnesium alloys, titanium-based materials such as titanium nitride (TiN) or titanium aluminum nitride (TiAlN), tantalum-based materials such as tantalum nitride (TaN), tantalum aluminum nitride (TaAlN), or tantalum carbide ($Ta_2C$), or the like. Preferably, the metal-comprising material is lanthanum. Metal-comprising material 60 preferably has a thickness of from about 0.1 to about 2 nm, although the actual thickness can vary depending on the application of the transistor in the circuit being implemented. A thin layer of oxide (not shown) may form on the metal-comprising material, such as by exposure to an ambient environment or other intentional oxidation. The oxide may serve to protect the metal-comprising material 60 from contamination. A layer of photoresist (not shown) is deposited onto the surface of the metal-comprising material 60. The photoresist may be any conventional hydrocarbon-based photoresist such as photoresist 3435 available from Tokyo Ohka Kogyo Co., Ltd of Japan or EPIC™ 2520 available from Rohm and Haas Electronic Materials of Phoenix, Ariz. In addition to the photoresist, a deposited bottom antireflective coating (BARC) may be deposited onto the surface of the metal-comprising material 60 before deposition of the photoresist. The photoresist, and any BARC, then is photolithographically patterned and etched using, for example, tetramethylammonium hydroxide (TMAH) to form a photoresist mask 62.

Figure 2:
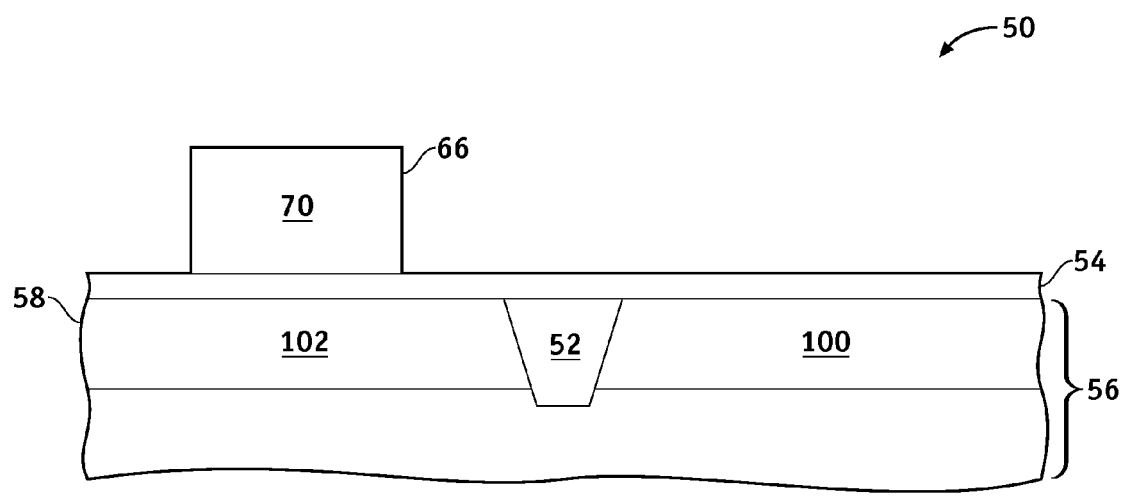
Figure 3:
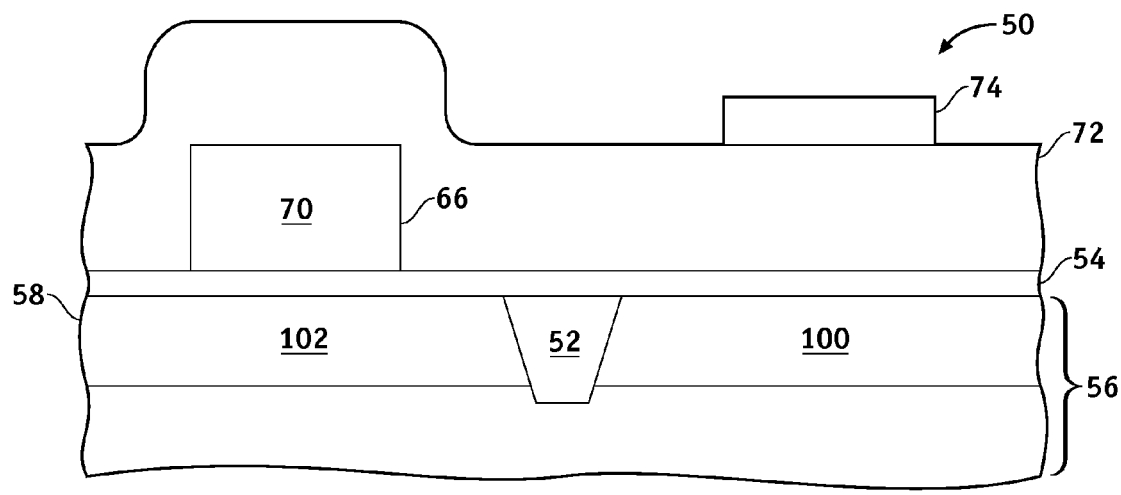

Referring to FIG. 2, the exposed metal-comprising material 60 is etched to form a first gate stack 66 comprising a gate electrode 70. Optionally, the gate insulating material 54 also may be etched to form a gate insulator of gate stack 66. The exposed metal-comprising material 60, and its oxide if present, is etched by exposing it to an aqueous non-chlorine-comprising acid solution having a pH of less than about 7. The aqueous non-chlorine-comprising acid solution can comprise at least one weak acid having a pH in the range of about 2 to less than about 7, at least one strong acid having a pH of about 2 or less, or a combination thereof with the acid or acids present in concentrations so that the solution has a pH of less than about 7. By increasing the concentration of the acid in the solution, the etch rate of the metal-comprising material can be increased to a desired rate. Accordingly, in one embodiment of the invention, a weak acid is present in the solution in a concentration of about 1% to about 100% by volume of the solution. In another embodiment of the invention, a strong acid is present in the solution in a concentration of about 5% to about 98% by volume of the solution. Concentrations outside of these ranges may result in uncontrollable etch rates that may cause etching of the metal-comprising material under the photoresist.

Examples of weak acids suitable for use in the aqueous non-chlorine-comprising acid solution include weak organic and inorganic acids. Examples of weak organic acids suitable for use include sulfonic acid, methanesulfonic acid, p-toluenesulfonic acid, phenylic acid, such as phenol, bisphenol-a, gallic acid, picric acid, butylated hydroxytoluene (BHT), and polyphenol, and carboxylic acids. Suitable carboxylic acids include straight-chained, saturated carboxylic acids such as formic acid, acetic acid, propionic acid, butyric acid, valeric acid, caproic acid, enanthic acid, caprylic acid, perlargonic acid, capric acid, lauric acid, palmitic acid, tartaric acid, and stearic acid Other carboxylic acids include short-chain (about 1 to about 7 carbons) unsaturated monocarboxylic acids such as acrylic acid, fatty acids having medium- (about 5 to about 10 carbons) to long-chain (more than about 10 carbons) saturated and unsaturated monocarboxylic acids with even numbers of carbons such as docosahexaenoic acid, eicosapentaenoic acid, amino acids, keto acids, pyruvic acid, and acetoacetic acid, aromatic carboxylic acids such as benzoic acid ($C_6H_5COOH$), and salicylic acid, and dicarboxylic acids that contain two carboxyl groups such as aldaric acid, oxalic acid, malonic acid, malic acid, succinic acid, glutaric acid, and adipic acid. Tricarboxylic acids having three carboxyl groups and alpha hydroxy acids containing a hydroxyl group also may be used in the aqueous non-chlorine-comprising acid solution. Examples of tricarboxylic acids include citric acid, isocitric acid, aconitic acid, and propane-1,2,3-tricarboxylic acid. Examples of suitable alpha hydroxy acids include glycolic acid ($C_2H_4O_3$) and lactic acid. Weak inorganic acids suitable for use include carbonic acid ($H_2CO_3$ or carbon dioxide in water), boric acid, phosphoric acid, and similar weak acids. Preferably, the weak acid is a carboxylic acid and, more preferably is acetic, citric, oxalic, glycolic, lauric, salicylic, malic, malonic, succinic, adipic, or tartaric acid.

Examples of strong acids suitable for use in the aqueous non-chlorine-comprising acid solution include inorganic and organic acids including hydroiodic acid, hydrobromic acid, sulfuric acid, nitric acid, bromic acid, perbromic acid, iodic acid, periodic acid, fluoroantimonic acid, magic acid ($FSO_3HSbF_5$), fluorosulfuric acid, and triflic acid. It will be appreciated that the aqueous non-chlorine-comprising solution also may comprise any combination of the above-disclosed acids.

In one exemplary embodiment, the aqueous non-chlorine-comprising acid solution comprises at least one functional additive. The term "functional" as used herein means that the additive can be used to control viscosity, corrosion, adhesion, wetting, rheology, or the like, of the solution. Examples of suitable functional additives that may be added to the solution include dispersants, pH modifiers, surfactants, wetting agents, antifoaming agents, detergents and other surface-tension modifiers, flame retardants, thickeners, viscosity modifiers, rheology modifiers, and mixtures thereof. After removal of the exposed metal-comprising material 60, the photoresist mask 62 is removed from gate stack 66.

Although other fabrication steps or sub-processes may be performed at this time (for example, deposition and patterning of other layers), this examples continues by fabricating overlying N-well region 100 a second gate electrode formed of a material with a work function different from that of the metal-comprising material 60. In this regard, referring to FIG. 3, a second gate electrode-forming material 72 with a work function different from that of the metal-comprising material 60 subsequently is deposited overlying the gate insulating material 54 and gate stack 66. Alternatively, if gate insulator material 54 was etched after etching of metal-comprising material 60, a second gate insulating material (not shown) may be globally deposited overlying semiconductor material 56 and gate stack 66 before deposition of second gate-electrode forming material 72. The second gate insulating material may comprise any of the gate insulating materials 54 described above with reference to FIG. 1. The second gate electrode-forming material 72 may comprise any conductive material having a work function different from the work function of first metal-comprising material 60. An example of a material suitable for second gate electrode-forming material 72 includes polycrystalline silicon. A patterned photoresist 74 is formed overlying gate electrode-forming material 72 and the N-well region 100.

Figure 4:
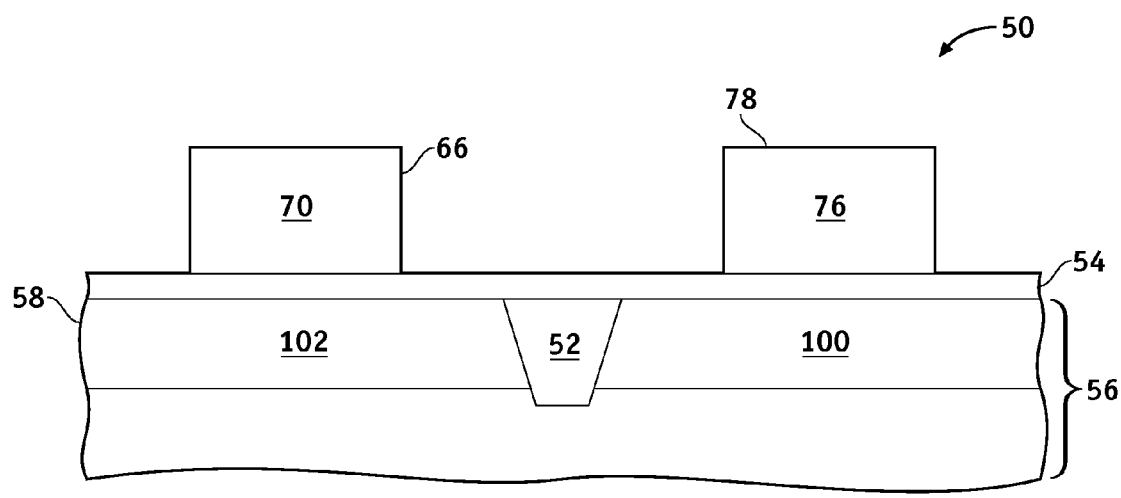

Referring to FIG. 4, the gate electrode-forming material 72, and additionally the second gate insulating material if present, is anisotropically etched to form a second gate electrode 76 of gate stack 78. The chemistry used to etch the gate electrode-forming material is dependent on the chemical composition of the material. However, if gate electrode 70 comprises lanthanum, preferably the etch chemistry does not contain chlorine, which otherwise may result in uncontrollable etching of the lanthanum-comprising gate electrode 70. For example, polycrystalline silicon can be etched in the desired pattern by reactive ion etching (RIE) using an $HBr/O_2$ chemistry. After the formation of gate stack 78, semiconductor device 50 can be further fabricated, such as by implanting impurity ions for the formation of source and drain regions and the formation of contacts thereto.

Accordingly, methods have been provided for the effective removal of a metal-comprising material and its oxide disposed thereon from a semiconductor material. The methods remove the metal-comprising material using an aqueous non-chlorine-comprising acid solution having a pH of about less than 7. The use of an aqueous non-chlorine-comprising acid solution having a pH of about less than 7 provides a method for removing the metal-comprising material that can be controlled so that the metal-comprising material is effectively removed from the semiconductor material without the simultaneous etching of any metal-comprising material underlying an etch mask. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for removing a metal-comprising material from a semiconductor material, the method comprising the steps of:
   providing the metal-comprising material overlying the semiconductor material; and
   exposing the metal-comprising material to an aqueous non-chlorine-comprising acid solution having a pH of less than 1.5.

2. The method of claim 1, wherein the step of providing comprises providing a metal-comprising material selected from the group consisting of lanthanum, lanthanum alloys, aluminum, aluminum alloys, magnesium, magnesium alloys, titanium-based materials, and tantalum-based materials.

3. The method of claim 1, wherein the step of exposing comprises exposing the metal-comprising material to the aqueous non-chlorine-comprising acid solution further comprising a weak acid having a pH in the range of about 2 to less than about 7.

4. The method of claim 3, wherein the step of exposing comprises exposing the metal-comprising material to the aqueous non-chlorine-comprising acid solution comprising a strong acid having a pH of less than 1.5 and a concentration of about 5% to about 98% by volume of the aqueous non-chlorine-comprising acid solution.

5. The method of claim 3, wherein the step of exposing comprises exposing the metal-comprising material to an aqueous non-chlorine-comprising acid solution comprising an acid selected from the group consisting of sulfonic acid, methanesulfonic acid, ρ-toluenesulfonic acid, phenylic acids, carboxylic acids, carbonic acid ($H_2CO_3$ or carbon dioxide in water), boric acid, phosphoric acid, and a combination thereof.

6. The method of claim 5, wherein the step of exposing comprises exposing the metal-comprising material to a carboxylic acid selected from the group consisting of formic acid, acetic acid, propionic acid, butyric acid, valeric acid, caproic acid, enanthic acid, caprylic acid, perlargonic acid, capric acid, lauric acid, palmitic acid, tartaric acid, stearic acid, acrylic acid, short-chain unsaturated monocarboxylic acids, docosahexaenoic acid, eicosapentaenoic acid, amino acids, keto acids, pyruvic acid, acetoacetic acid, fatty acids having medium- to long-chain saturated and unsaturated monocarboxylic acids with even numbers of carbons, benzoic acid, salicylic acid, aromatic carboxylic acids, aldaric acid, oxalic acid, malonic acid, malic acid, succinic acid, glutaric acid, adipic acid, dicarboxylic acids, citric acid, isocitric acid, aconitic acid, propane-1,2,3-tricarboxylic acid, tricarboxylic acids, glycolic acid, lactic acid, alpha hydroxy acids, and combinations thereof.

7. The method of claim 1, wherein the step of exposing comprises exposing the metal-comprising material to an aqueous non-chlorine-comprising acid solution comprising an acid selected from the group consisting of hydroiodic acid, hydrobromic acid, sulfuric acid, nitric acid, bromic acid, perbromic acid, iodic acid, periodic acid, fluoroantimonic acid, magic acid, fluorosulfuric acid, triflic acid, and a combination thereof.

8. The method of claim 1, wherein the step of exposing comprises exposing the metal-comprising material to an aqueous non-chlorine-comprising acid solution comprising a functional additive selected from the group consisting of dispersants, pH modifiers, surfactants, wetting agents, antifoaming agents, detergents and other surface-tension modifiers, flame retardants, thickeners, viscosity modifiers, rheology modifiers, and mixtures thereof.

9. The method of claim 1, wherein the step of exposing comprises exposing the metal-comprising material and an oxide of the metal-comprising material disposed thereon to an aqueous non-chlorine-comprising acid solution having a pH of less than 1.5.

10. A method for fabricating a semiconductor device, the method comprising the steps of:
    forming a high dielectric constant gate insulating material overlying a substrate;
    depositing a metal-comprising material overlying the high dielectric constant gate insulating material;
    forming a patterned photoresist on the metal-comprising material;
    exposing the metal-comprising material to an aqueous non-chlorine-comprising acid solution having a pH in the range of less than 1.5 to form a first gate stack; and
    removing the patterned photoresist from the first gate stack.

11. The method of claim 10, wherein the step of depositing comprises depositing a material selected from the group consisting of lanthanum, lanthanum alloys, aluminum, aluminum alloys, magnesium, magnesium alloys, titanium-based materials, and tantalum-based materials.

12. The method of claim 10, wherein the step of exposing comprises exposing the metal-comprising material to the aqueous non-chlorine-comprising acid solution further comprising a weak acid having a pH in the range of about 2 to less than about 7.

13. The method of claim 12, wherein the step of exposing comprises exposing the metal-comprising material to the aqueous non-chlorine-comprising acid solution comprising a strong acid having a pH of less than 1.5 and a concentration of about 5% to about 98% by volume of the aqueous non-chlorine-comprising acid solution.

14. The method of claim 12, wherein the step of exposing comprises exposing the metal-comprising material to an aqueous non-chlorine-comprising acid solution comprising an acid selected from the group consisting of sulfonic acid, methanesulfonic acid, ρ-toluenesulfonic acid, phenylic acid, formic acid, acetic acid, propionic acid, butyric acid, valeric acid, caproic acid, enanthic acid, caprylic acid, perlargonic acid, capric acid, lauric acid, palmitic acid, tartaric acid, stearic acid, acrylic acid, short-chain unsaturated monocarboxylic acids, docosahexaenoic acid, eicosapentaenoic acid, amino acids, keto acids, pyruvic acid, acetoacetic acid, fatty acids having medium- to long-chain saturated and unsaturated monocarboxylic acids with even numbers of carbons, benzoic acid, salicylic acid, aromatic carboxylic acids, aldaric acid, oxalic acid, malonic acid, malic acid, succinic acid, glutaric acid, adipic acid, dicarboxylic acids, citric acid, isocitric acid, aconitic acid, propane-1,2,3-tricarboxylic acid, tricarboxylic acids, glycolic acid, lactic acid, alpha hydroxy acids, carbonic acid ($H_2CO_3$ or carbon dioxide in water), boric acid, phosphoric acid, and a combination thereof.

15. The method of claim 10, wherein the step of exposing comprises exposing the metal-comprising material to an aqueous non-chlorine-comprising acid solution comprising an acid selected from the group consisting of hydroiodic acid, hydrobromic acid, sulfuric acid, nitric acid, bromic acid, perbromic acid, iodic acid, periodic acid, fluoroantimonic acid, magic acid, fluorosulfuric acid, triflic acid, and a combination thereof.

16. A method for forming a CMOS device, the method comprising the steps of:

depositing a lanthanum layer overlying a high dielectric constant material disposed on a semiconductor material having an N-well region for use in fabricating a P-channel MOS and a P-well region for use in fabricating an N-channel MOS;

forming a patterned photoresist on the lanthanum layer, the patterned photoresist overlying the P-well region;

etching the lanthanum layer using an aqueous non-chlorine-comprising acid solution having a pH of less than 1.5 to form a first gate stack overlying the P-well region;

at least substantially removing the patterned photoresist from the first gate stack;

globally depositing a gate electrode-forming material having a work function different from the work function of the lanthanum layer overlying the first gate stack and the N-well region of semiconductor material; and etching the gate electrode-forming material to form a gate electrode overlying the N-well region.

17. The method of claim 16, wherein the step of etching the lanthanum layer comprises etching the lanthanum layer using the aqueous non-chlorine-comprising acid solution further comprising a weak acid having a pH in the range of about 2 to less than about 7.

18. The method of claim 17, wherein the step of etching the lanthanum layer comprises etching the lanthanum layer using the aqueous non-chlorine-comprising acid solution comprising a weak acid having a pH in the range of about 2 to less than about 7 and a strong acid having a pH of less than 1.5 and a concentration of about 5% to about 98% by volume of the aqueous non-chlorine-comprising acid solution.

19. The method of claim 17, wherein the step of etching the lanthanum layer comprises etching the lanthanum layer using an aqueous non-chlorine-comprising acid solution comprising an acid selected from the group consisting of sulfonic acid, methanesulfonic acid, ρ-toluenesulfonic acid, phenylic acid, formic acid, acetic acid, propionic acid, butyric acid, valeric acid, caproic acid, enanthic acid, caprylic acid, perlargonic acid, capric acid, lauric acid, palmitic acid, tartaric acid, stearic acid, acrylic acid, short-chain unsaturated monocarboxylic acids, docosahexaenoic acid, eicosapentaenoic acid, amino acids, keto acids, pyruvic acid, acetoacetic acid, fatty acids having medium- to long-chain saturated and unsaturated monocarboxylic acids with even numbers of carbons, benzoic acid, salicylic acid, aromatic carboxylic acids, aldaric acid, oxalic acid, malonic acid, malic acid, succinic acid, glutaric acid, adipic acid, dicarboxylic acids, citric acid, isocitric acid, aconitic acid, propane-1,2,3-tricarboxylic acid, tricarboxylic acids, glycolic acid, lactic acid, alpha hydroxy acids, carbonic acid ($H_2CO_3$ or carbon dioxide in water), boric acid, phosphoric acid, and a combination thereof.

* * * * *